(12) United States Patent
Park

(10) Patent No.: US 10,978,673 B2
(45) Date of Patent: *Apr. 13, 2021

(54) DISPLAY DEVICE AND ORGANIC LUMINESCENT DISPLAY DEVICE

(71) Applicant: Samsung Display Co., Ltd., Yongin-si (KR)

(72) Inventor: Myoung-Seo Park, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/532,300

(22) Filed: Aug. 5, 2019

(65) Prior Publication Data
US 2019/0363294 A1    Nov. 28, 2019

Related U.S. Application Data

(63) Continuation of application No. 15/871,115, filed on Jan. 15, 2018, now Pat. No. 10,418,588, which is a continuation of application No. 13/840,879, filed on Mar. 15, 2013, now Pat. No. 9,893,312.

(30) Foreign Application Priority Data

Nov. 29, 2012 (KR) .................. 10-2012-0137336

(51) Int. Cl.
*H01L 51/52*   (2006.01)
*H01L 27/32*   (2006.01)

(52) U.S. Cl.
CPC ...... *H01L 51/5253* (2013.01); *H01L 27/3244* (2013.01); *H01L 27/3276* (2013.01)

(58) Field of Classification Search
CPC .................. H01L 27/3244; H01L 27/3276
USPC .................. 257/40; 313/504; 349/42
See application file for complete search history.

(56) References Cited

U.S. PATENT DOCUMENTS

| 7,158,694 B2 | 1/2007 | Hayashi et al. |
| 7,902,751 B2 | 3/2011 | Hayashi |
| 7,902,755 B2 | 3/2011 | Kubota |
| 8,421,349 B2 | 4/2013 | Fujimura et al. |

(Continued)

FOREIGN PATENT DOCUMENTS

| JP | 2010117549 A | 5/2010 |
| JP | 2010218719 A | 9/2010 |

(Continued)

OTHER PUBLICATIONS

Korean Registration Determination Certificate issued by KIPO on Nov. 15, 2014 in connection with KR 10-2012-0137336 which is the priority document of the present application and Request for Entry of the Accompanying Office Action attached herewith.

(Continued)

*Primary Examiner* — David Vu
*Assistant Examiner* — Brandon C Fox
(74) *Attorney, Agent, or Firm* — Lewis Roca Rothgerber Christie LLP

(57) ABSTRACT

Provided is a display device including: a structure including a display area and a peripheral area surrounding the display area; and an inorganic encapsulation thin film disposed on the display and peripheral areas. The peripheral area includes at least one inorganic surface portion having a closed shape continuously.

24 Claims, 5 Drawing Sheets

(56) References Cited

U.S. PATENT DOCUMENTS

| | | |
|---|---|---|
| 10,418,588 B2 * | 9/2019 | Park .................... H01L 27/3244 |
| 2003/0127657 A1 | 7/2003 | Park |
| 2006/0158111 A1 | 7/2006 | Hayashi |
| 2007/0019126 A1 | 1/2007 | Rhee et al. |
| 2008/0224949 A1 | 9/2008 | Lee et al. |
| 2009/0040446 A1 | 2/2009 | Hong et al. |
| 2010/0320909 A1 | 12/2010 | Izumi |
| 2011/0006972 A1 | 1/2011 | Tanaka |
| 2011/0210348 A1 | 9/2011 | Yuasa |
| 2012/0062107 A1 | 3/2012 | Fujimura et al. |

FOREIGN PATENT DOCUMENTS

| | | |
|---|---|---|
| JP | 2010218940 A | 9/2010 |
| JP | 2010231908 A | 10/2010 |
| KR | 10-2006-0123044 | 12/2006 |
| KR | 10-2008-0031115 | 4/2008 |
| KR | 10-2008-0084462 | 9/2008 |
| KR | 10-2009-0045847 | 5/2009 |

OTHER PUBLICATIONS

Korean Office Action issued by KIPO dated May 16, 2014 in connection with KR 10-2012-0137336 which is the priority document of the present application and Request for Entry of the Accompanying Office Action attached herewith.

\* cited by examiner

DISPLAY DEVICE AND ORGANIC LUMINESCENT DISPLAY DEVICE

CROSS-REFERENCE TO RELATED APPLICATION

This application is a continuation of U.S. patent application Ser. No. 15/871,115, filed Jan. 15, 2018, which is a continuation of U.S. patent application Ser. No. 13/840,879, filed Mar. 15, 2013, now U.S. Pat. No. 9,893,312, which claims priority to and the benefit of Korean Patent Application No. 10-2012-0137336, filed Nov. 29, 2012, the entire content of all of which is incorporated herein by reference.

BACKGROUND

1. Field

An embodiment of the present invention relates to a display device and an organic luminescent display device, and more particularly, to a display device and an organic luminescent display device which include a thin film encapsulation structure.

2. Description of the Related Art

An organic luminescent display device using an organic light-emitting device is capable of displaying a moving image since the organic luminescent display device has a quicker response speed than a liquid crystal display (LCD) that is currently widely commercialized, and is receiving attention as a next-generation display device since the organic luminescent display device is self-emissive, has a wider viewing angle, and has higher luminance.

The organic light-emitting device includes a pixel electrode and a counter electrode, which face each other, and an emissive layer including an organic material disposed between the pixel electrode and the counter electrode. The organic light-emitting device is very sensitive to moisture, oxygen, and light, and thus may deteriorate by contacting them. Also, when oxygen or moisture is diffused into an organic layer, oxide is generated as an electrochemical charge transfer occurs on an interface between the pixel and counter electrodes and the organic layer, and a dark spot may occur as the oxide separates the organic layer and the pixel or counter electrode, thereby decreasing a life of the organic light-emitting device. Accordingly, the organic light-emitting device has a thin film encapsulation structure so as to block external moisture, oxygen, or light from being transferred into the organic light-emitting device.

The above information disclosed in this Background section is only for enhancement of understanding of the background of the described technology and therefore it may contain information that does not form the prior art that is already known in this country to a person of ordinary skill in the art.

SUMMARY

One or more embodiments of the present invention provide a display device and an organic light-emitting device, which include a thin film encapsulation structure.

In accordance with one aspect of the present invention, an electroluminescent device may be provided. The electroluminescent device may comprise a lower structure and a flexible encapsulation multilayer. The lower structure may have an emission area and a peripheral area surrounding the emission area. The lower structure may comprise a first insulation film including an inorganic material, a second insulation film located on the first insulation film, a lower electrode located on the second insulation film, an electroluminescent layer located on the lower electrode, an upper electrode located on the electroluminescent layer, and a conductor located on a top surface of the first insulation film, and side and top surfaces of the second insulation film to be electrically connected to the upper electrode. The flexible encapsulation multilayer may be located on the emission and peripheral areas of the lower structure. The flexible encapsulation multilayer may include at least three layers. The flexible encapsulation multilayer may have a bottom surface comprising only at least one inorganic material. The conductor may comprise a first inorganic wiring extending on the top surface of the first insulation film along a periphery of the emission area, and a second inorganic wiring which extends on the side and top surfaces of the second insulation film along the periphery of the emission area. The second inorganic wiring may have a bottom surface electrically facing a top surface of the first inorganic wiring to electrically communicate with the top surface of the first inorganic wiring. The second inorganic wiring may have a top surface electrically facing a bottom surface of the upper electrode to electrically communicate with the bottom surface of the upper electrode. A surface of the peripheral area may comprise an inorganic surface portion located outside the upper electrode in a plan view. The inorganic surface portion may substantially surround the emission area of the lower structure. An entire of the inorganic surface portion may directly contact the bottom surface of the flexible encapsulation multilayer. The inorganic surface portion may comprise a plurality of stepped surface portions, each including a top surface portion of the first insulation film, a side surface portion of the first inorganic wiring, and a top surface portion of the first inorganic wiring. The first inorganic wiring may have an inner edge portion and an outer edge portion substantially opposite to the inner edge portion. The outer edge portion of the first inorganic wiring may be substantially farther than the inner edge portion from the emission area. The outer edge portion of the first inorganic wiring may be located under the bottom surface of the flexible encapsulation multilayer. The outer edge portion of the first inorganic wiring may be not in direct contact with the bottom surface of the flexible encapsulation multilayer.

In some exemplary embodiments, the inorganic surface portion may further comprise a plurality of stepped surface portions, each including a top surface portion of the first inorganic wiring, a side surface portion of the second inorganic wiring, and a top surface portion of the second inorganic wiring. The second inorganic wiring may have an inner edge portion and an outer edge portion substantially opposite to the inner edge portion. The outer edge portion of the second inorganic wiring may be substantially farther than the inner edge portion from the emission area. The outer edge portion of the second inorganic wiring may be located under the bottom surface of the flexible encapsulation multilayer. The outer edge portion of the second inorganic wiring may be not in direct contact with the bottom surface of the flexible encapsulation multilayer.

In some exemplary embodiments, the inorganic surface portion may further comprise a plurality of stepped surface portions, each including a top surface portion of the first insulation film, a side surface portion of the second inorganic wiring, and a top surface portion of the second inorganic wiring. The second inorganic wiring may have an inner edge portion and an outer edge portion substantially opposite to the inner edge portion. The outer edge portion of the second inorganic wiring may be substantially farther than the inner edge portion from the emission area. The outer edge portion of the second inorganic wiring may be located under the bottom surface of the flexible encapsulation multilayer. The outer edge portion of the second inorganic wiring may be not in direct contact with the bottom surface of the flexible encapsulation multilayer.

In some exemplary embodiments, the inorganic surface portion further may comprise a plurality of stepped surface portions, each including a top surface portion of the first inorganic wiring, a side surface portion of the second inorganic wiring, and a top surface portion of the second inorganic wiring. The inorganic surface portion may further comprise a plurality of stepped surface portions, each including a top surface portion of the first insulation film, a side surface portion of the second inorganic wiring, and a top surface portion of the second inorganic wiring. The second inorganic wiring may have an inner edge portion and an outer edge portion substantially opposite to the inner edge portion. The outer edge portion of the second inorganic wiring may be substantially farther than the inner edge portion from the emission area. The outer edge portion of the second inorganic wiring may be located under the bottom surface of the flexible encapsulation multilayer. The outer edge portion of the second inorganic wiring may be not in direct contact with the bottom surface of the flexible encapsulation multilayer.

In some exemplary embodiments, the electroluminescent device may further comprise an organic layer which may be located between the upper electrode and the bottom surface of the flexible encapsulation multilayer. The organic layer may be in direct contact with the upper electrode. The organic layer may have a conductive or semi-conductive property.

In accordance with another aspect of the present invention, an electroluminescent device may be provided. The electroluminescent device may comprise a lower structure and a flexible encapsulation multilayer. The lower structure may have an emission area and a peripheral area surrounding the emission area. The lower structure may comprise a first insulation film, a second insulation film located on the first insulation film, a lower electrode located on the second insulation film, an electroluminescent layer located on the lower electrode, an upper electrode located on the electroluminescent layer, and a conductor located on a top surface of the first insulation film, and side and top surfaces of the second insulation film to be electrically connected to the upper electrode. The flexible encapsulation multilayer may be located on the emission and peripheral areas of the lower structure. The flexible encapsulation multilayer may include at least three layers. The flexible encapsulation multilayer may have a bottom surface comprising only at least one inorganic material. A surface of the peripheral area may comprise an inorganic surface portion located outside the upper electrode in a plan view. The inorganic surface portion may substantially surround the emission area of the lower structure. An entire of the inorganic surface portion may directly contact the bottom surface of the flexible encapsulation multilayer. The conductor may comprise a first inorganic wiring located on the top surface of the first insulation film, and a second inorganic wiring located on the side and top surfaces of the second insulation film. The second inorganic wiring may have a bottom surface electrically facing a top surface of the first inorganic wiring to electrically communicate with the top surface of the first inorganic wiring. The second inorganic wiring may have a top surface electrically facing a bottom surface of the upper electrode to electrically communicate with the bottom surface of the upper electrode. At least a portion of a surface of the conductor may directly contact the bottom surface of the flexible encapsulation multilayer to be included in the inorganic surface portion.

In some exemplary embodiments, the electroluminescent device may further comprise an organic layer which may be located between the upper electrode and the bottom surface of the flexible encapsulation multilayer. The organic layer may be in direct contact with the upper electrode. The organic layer may have a conductive or semi-conductive property.

In accordance with still another aspect of the present invention, an electroluminescent device may be provided. The electroluminescent device may comprise a lower structure and a flexible encapsulation multilayer. The lower structure may have an emission area and a peripheral area surrounding the emission area. The lower structure may comprise a second insulation film, a lower electrode located on the second insulation film, an electroluminescent layer located on the lower electrode, and an upper electrode located on the electroluminescent layer. The flexible encapsulation multilayer may be located on the emission and peripheral areas of the lower structure. The flexible encapsulation multilayer may include at least three layers. The flexible encapsulation multilayer may have a bottom surface comprising only at least one inorganic material. A surface of the peripheral area may comprise an inorganic surface portion located outside the upper electrode in a plan view. The inorganic surface portion may substantially surround the emission area of the lower structure. The inorganic surface portion may comprise a plurality of inorganic surface branches spaced apart from each other. The surface of the peripheral area may comprise an organic surface portion substantially surrounding the emission area of the lower structure. The organic surface portion may have a predetermined height. The organic surface portion may be located between the inorganic surface branches to be substantially surrounded by the inorganic surface portion. An entire of the inorganic surface portion and an entire of the organic surface portion may be in direct contact with the bottom surface of the flexible encapsulation multilayer. The inorganic surface branches may include an outer inorganic surface branch located outer than the organic surface portion and an inner inorganic surface branch located inner than the organic surface portion. A height of the inner inorganic surface branch may be substantially larger than a height of the outer inorganic surface branch. The lower structure further may comprise a first inorganic wiring located on a top surface of the first insulation film. A second inorganic wiring may be located on side and top surfaces of the second insulation film. The second inorganic wiring may have a bottom surface electrically facing a top surface of the first inorganic wiring to electrically communicate with the top surface of the first inorganic wiring. The second inorganic wiring may have a top surface electrically facing a bottom surface of the upper electrode to electrically communicate with the bottom surface of the upper electrode. The inner inorganic surface branch may include at least a portion of the top surface of the second inorganic wiring.

In some exemplary embodiments, a portion of a surface of the first inorganic wiring may directly contact the lower surface of the flexible encapsulation multilayer. The portion of the surface of the first inorganic wiring may be substantially farther than the organic surface portion from the emission area. Here, the portion of the surface of the first inorganic wiring, which may directly contact the lower surface of the flexible encapsulation multilayer, may be included in the outer inorganic surface branch.

In accordance with still another aspect of the present invention, an electroluminescent device may be provided. The electroluminescent device may include a lower structure and a flexible encapsulation multilayer. The lower structure may have an emission area and a peripheral area surrounding the emission area. The lower structure may comprise a first insulation film, an inorganic capping film located on the first insulation film, a second insulation film located on the inorganic capping film, a lower electrode located on the second insulation film, an electroluminescent layer located on the lower electrode, an upper electrode located on the electroluminescent layer, and a conductor located on a top surface of the first insulation film, and side and top surfaces of the second insulation film to be electrically connected to the upper electrode. The flexible encapsulation multilayer may be located on the emission and peripheral areas of the lower structure. The flexible encapsulation multilayer may include at least three layers. The flexible encapsulation multilayer may have a bottom surface comprising only at least one inorganic material. The conductor may comprise a first inorganic wiring extending on the top surface of the first insulation film along a periphery of the emission area, and a second inorganic wiring which extends on the side and top surfaces of the second insulation film along the periphery of the emission area. The second inorganic wiring may have a bottom surface electrically facing a top surface of the first inorganic wiring to electrically communicate with the top surface of the first inorganic wiring. The second inorganic wiring may have a top surface electrically facing a bottom surface of the upper electrode to electrically communicate with the bottom surface of the upper electrode. A surface of the peripheral area may comprise an inorganic surface located outside the upper electrode in a plan view. The inorganic surface may substantially surround the emission area of the lower structure. An entire of the inorganic surface may directly contact the bottom surface of the flexible encapsulation multilayer. The inorganic capping film may have an opening exposing the top surface of first inorganic wiring.

In some exemplary embodiments, the electroluminescent device may further comprise an organic spacer which is located on a region where the first inorganic wiring and the second inorganic wiring are in direct contact with each other. The organic spacer may be located under the bottom surface of the flexible encapsulation multilayer.

In some exemplary embodiments, the first inorganic wiring may have an inner edge portion and an outer edge portion substantially opposite to the inner edge portion. The outer edge portion of the first inorganic wiring may be substantially farther than the inner edge portion from the emission area. The outer edge portion of the first inorganic wiring may be located under the bottom surface of the flexible encapsulation multilayer. The inorganic capping film may be located between the outer edge portion of the first inorganic wiring and the bottom surface of the flexible encapsulation multilayer such that the outer edge portion of the first inorganic wiring may be not in direct contact with the bottom surface of the flexible encapsulation multilayer.

In some exemplary embodiments, the second inorganic wiring may have an inner edge portion and an outer edge portion substantially opposite to the inner edge portion. The outer edge portion of the second inorganic wiring may be substantially farther than the inner edge portion from the emission area. The outer edge portion of the second inorganic wiring may be located under the bottom surface of the flexible encapsulation multilayer. The outer edge portion of the second inorganic wiring may be not in direct contact with the bottom surface of the flexible encapsulation multilayer.

In some exemplary embodiments, the first inorganic wiring may have an inner edge portion and an outer edge portion substantially opposite to the inner edge portion. The outer edge portion of the first inorganic wiring may be substantially farther than the inner edge portion from the emission area. The outer edge portion of the first inorganic wiring may be located under the bottom surface of the flexible encapsulation multilayer. The inorganic capping film may be located between the outer edge portion of the first inorganic wiring and the bottom surface of the flexible encapsulation multilayer such that the outer edge portion of the first inorganic wiring may be not in direct contact with the bottom surface of the flexible encapsulation multilayer. The second inorganic wiring may have an inner edge portion and an outer edge portion substantially opposite to the inner edge portion. The outer edge portion of the second inorganic wiring may be substantially farther than the inner edge portion from the emission area. The outer edge portion of the second inorganic wiring may be located under the bottom surface of the flexible encapsulation multilayer. The outer edge portion of the second inorganic wiring may be not in direct contact with the bottom surface of the flexible encapsulation multilayer.

In some exemplary embodiments, an electroluminescent device may further comprise an organic layer which may be located between the upper electrode and the bottom surface of the flexible encapsulation multilayer. The organic layer may be in direct contact with the upper electrode. The organic layer may have a conductive or semi-conductive property.

In accordance with still another aspect of the present invention, an electroluminescent device may be provided. The electroluminescent device may comprise a lower structure and a flexible encapsulation multilayer. The lower structure may have an emission area and a peripheral area surrounding the emission area. The lower structure may comprise a first insulation film, a second insulation film located on the first insulation film, a lower electrode located on the second insulation film, an electroluminescent layer located on the lower electrode, an upper electrode located on the electroluminescent layer, and a conductor located on a top surface of the first insulation film, and side and top surfaces of the second insulation film to be electrically connected to the upper electrode. The flexible encapsulation multilayer may be located on the emission and peripheral areas of the lower structure. The flexible encapsulation multilayer may include at least three layers. The flexible encapsulation multilayer may have a bottom surface comprising only at least one inorganic material. The emission area may include a plurality of emission regions each in which all of the lower electrode, the electroluminescent layer, and the upper electrode simultaneously overlap one another in a plan view. A light may be emitted from the emission region. The conductor may comprise a first inorganic wiring extending on the top surface of the first insulation film, and a second inorganic wiring extending on the side and top surfaces of the second insulation film and a top surface of the first inorganic wiring. The second inorganic wiring may be not overlapped with the emission region in a plan view. The second inorganic wiring may have a bottom surface electrically facing the top surface of the first inorganic wiring to electrically communicate with the top surface of the first inorganic wiring. The second inorganic wiring may have a top surface electrically facing a bottom surface of the upper electrode to electrically communicate with the bottom surface of the upper electrode. A surface of the peripheral area may comprise an inorganic surface portion located outside the upper electrode in a plan view. The inorganic surface portion may substantially surround the emission area of the lower structure. An entire of the inorganic surface portion may contact the bottom surface of the flexible encapsulation multilayer. A first region where the top surface of the first inorganic wiring may contact the bottom surface of the second inorganic wiring may be spaced apart from a second region where the top surface of the second inorganic wiring may contact the bottom surface of the upper electrode such that the first and second regions may not overlap each other in a plan view. The first region may have a height substantially lower than that of the second region.

In some exemplary embodiments, the first inorganic wiring may be disposed along a periphery of the emission area. The second inorganic wiring may be disposed along the periphery of the emission area.

In some exemplary embodiments, the electroluminescent device may further comprise an organic layer which may be located between the upper electrode and the bottom surface of the flexible encapsulation multilayer. The organic layer may contact the upper electrode. The organic layer may have a conductive or semi-conductive property. Here, the electroluminescent device may further comprise a passivation film comprising a fluoride of an alkali metal between the organic layer and the bottom surface of the flexible encapsulation multilayer.

In some exemplary embodiments, the electroluminescent device may further comprise an inorganic capping film located on the first insulation film such that the second insulation film may be located on the inorganic capping film. The inorganic capping film may have an opening exposing the top surface of first inorganic wiring.

In some exemplary embodiments, the electroluminescent device may further comprise an organic structure having a first portion located between the second inorganic wiring and the upper electrode such that the first portion may contact the second inorganic wiring.

In some exemplary embodiments, the organic structure may further comprise a second portion located above the first region such that the second portion may contact a portion of the second inorganic wiring. The portion of the second inorganic wiring may correspond to the first region.

In some exemplary embodiments, the first and second regions may be located substantially inner than the entire of the inorganic surface portion.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
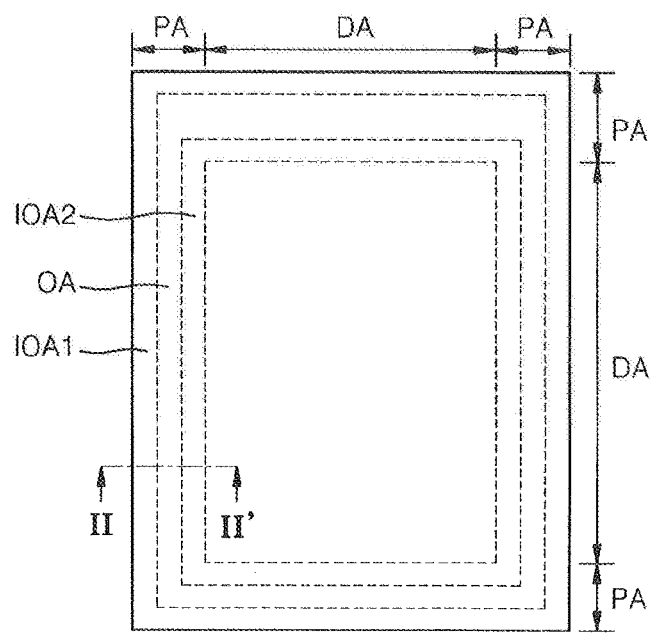
FIG. 1 is a plan view schematically illustrating a structure of a display device, according to an embodiment of the present invention.

Hereinafter, the present invention will be described more fully with reference to the accompanying drawings, in which exemplary embodiments of the invention are shown.

So as to clearly describe the present invention, an element unrelated to the present invention is neither illustrated nor described, or simply illustrated or described. Also, in drawings, thicknesses and widths of layers and regions may be exaggerated for clarity.

In the drawings, like reference numerals denote like elements. The terms "first," "second," and the like used herein do not have limitative meanings, but are used to distinguish one element from another. It will also be understood that when a portion, such as a layer, a region, or an element is referred to as being "on" another portion, it can be directly on the other portion, or an intervening layers, region, or element may also be present.

As used herein, the term "and/or" includes any and all combinations of one or more of the associated listed items. Expressions such as "at least one of," when preceding a list of elements, modify the entire list of elements and do not modify the individual elements of the list. In the claims, the term of "'element' portion" refers to at least a portion of the entire 'element.' For example, the claimed term of "an inorganic surface portion" refers to at least a portion of the entire inorganic surface. In the claims, counting the number of 'element' portions is possible when the 'element' portions are separated from each other in a plan view such that merging the 'element' portions into one 'element' portion is not possible.

Figure 2:
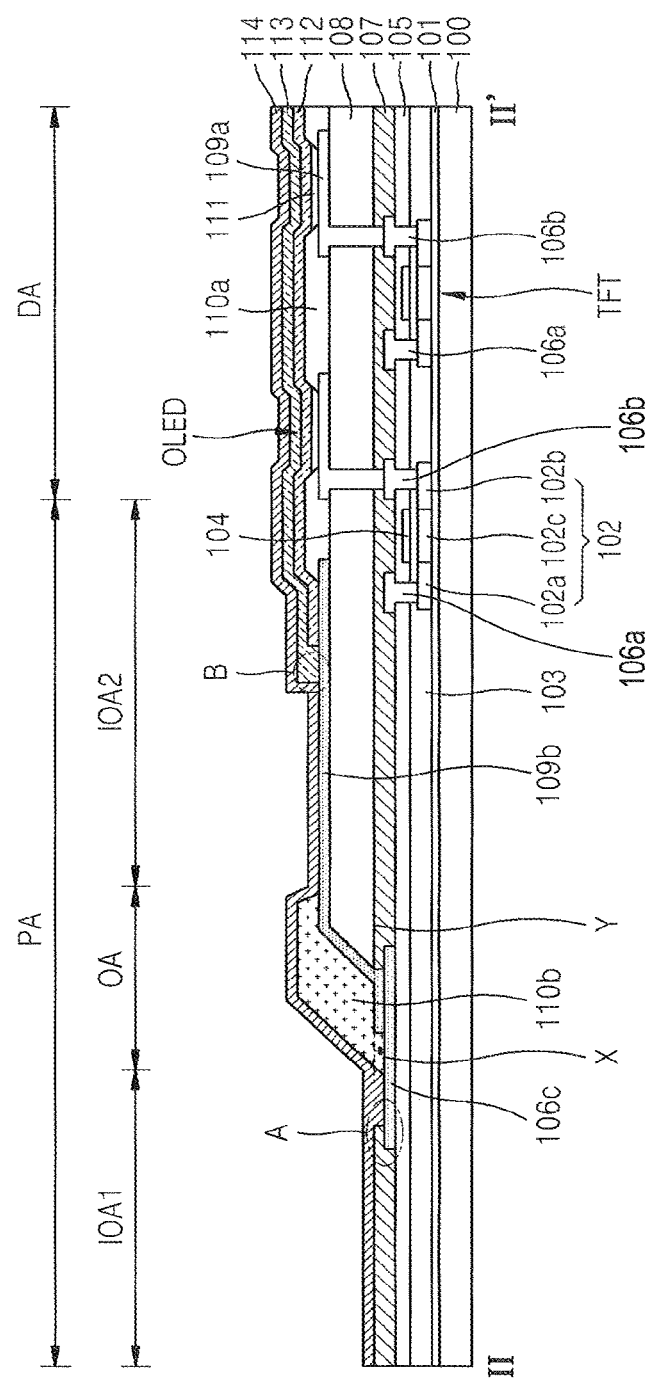
FIG. 2 is a cross-sectional view taken along a line II-II' of FIG. 1.
Figure 3:
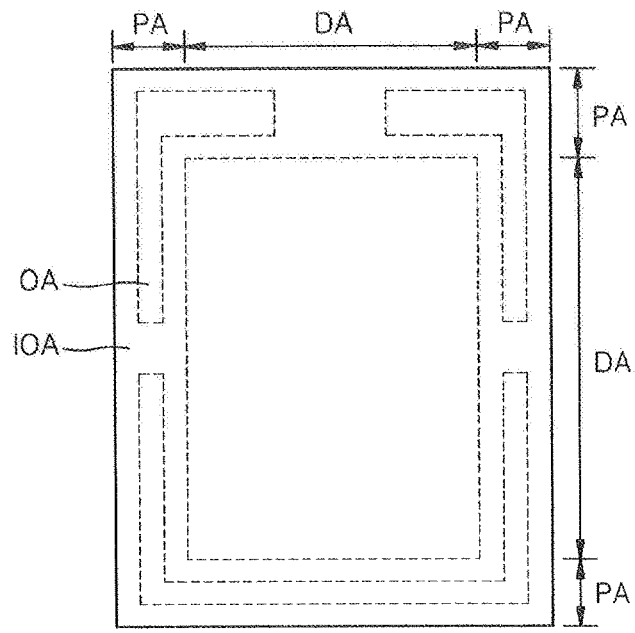
FIG. 3 is a plan view schematically illustrating a structure of a display device, according to another embodiment of the present invention.

FIG. 1 is a plan view schematically illustrating a structure of a display device, according to an embodiment of the present invention. FIG. 2 is a cross-sectional view taken along a line II-II' of FIG. 1. FIG. 3 is a plan view schematically illustrating a structure of a display device, according to another embodiment of the present invention.

In reference to FIGS. 1 and 2, the display device includes a substrate 100, a thin film transistor (TFT) array and an organic light-emitting device (OLED) that are formed on the substrate 100, and an encapsulation thin film 114 sealing the OLED.

The substrate 100 supports the entire display device and maintains rigidity. The substrate 100 may have a flat top surface and be formed of a transparent insulating material. For example, the substrate 100 may be formed of glass. However, alternatively, the substrate 100 may be formed of a plastic material, such as polyethersulphone (PES) or polyacrylate (PAR). Alternatively, the substrate 100 may be formed of an opaque material, such as a metal or a carbon fiber, or may be formed of flexible plastic, such as a polyimide (PI) film so as to realize a flexible display device.

The substrate 100 is divided into a display area DA and a peripheral area PA disposed around the display area DA. The display area DA is disposed at center of the substrate 100 and is an area where an image is displayed. The peripheral area PA is disposed at an edge of the substrate 100 to surround the display area DA and is an area where an image is not displayed.

A plurality of OLEDs emitting light for displaying an image are disposed in the display area DA according to pixels. A wire 106c and a connecting pad 109b for applying an electric signal or power to the OLED disposed on the display area DA are disposed in the peripheral area PA. Hereinafter, components disposed in the display area DA and the peripheral area PA are described in an order staked from the substrate 100.

A buffer film 101 is formed on the substrate 100. The buffer film 101 flattens the top surface of the substrate 100 and blocks impurities from penetrating into the substrate 100. The buffer film 101 may have a multilayer or single layer structure formed of an inorganic material, such as silicon oxide (SiOx) and/or silicon nitride (SiNx), and may be formed via any one of various deposition methods. The buffer film 101 may not be formed as occasion demands.

A driving circuit unit is formed on the buffer film 101. The driving circuit unit includes at least one TFT. The TFT is electrically connected to the OLED to drive the OLED. Although not illustrated, the driving circuit unit may further include at least one capacitor. Meanwhile, in FIG. 2, the TFT is a top gate type sequentially including an active layer 102, a gate electrode 104, a source electrode 106a, and a drain electrode 106b, but alternatively, any type of TFT may be employed, such as a bottom gate type.

The active layer 102 is formed on the buffer film 101. The active layer 102 includes a semiconductor material, for example, may include amorphous silicon or polycrystalline silicon. However, alternatively, the active layer 102 may include an oxide semiconductor material, such as G—I—Z—O[(In$_2$O$_3$)a(Ga$_2$O$_3$)b(ZnO)c], wherein a, b, and c are each a real number satisfying a≥0, b≥0, and c>0. Aside from GIZO, the active layer 102 may include an oxide of a material selected from the group consisting of group 12, 13, and 14 metal elements, such as zinc (Zn), indium (In), gallium (Ga), tin (Sn), cadmium (Cd), germanium (Ge), and hafnium (Hf), and a combination thereof. The active layer 102 includes a source region 102a and a drain region 102b respectively contacting the source electrode 106a and the drain electrode 106b, and a channel region 102c disposed between the source and drain regions 102a and 102b. When the active layer 102 includes amorphous silicon or polycrystalline silicon, impurities may be doped on the source and drain regions 102a and 102b if required.

A gate insulating film 103 is formed on the active layer 102, and may have a multilayer or single layer structure formed of an inorganic material, such as silicon oxide and/or silicon nitride. The gate insulating film 103 insulates the active layer 102 and the gate electrode 104 from each other.

The gate electrode 104 is formed on the gate insulating film 103. The gate electrode 104 is connected to a gate line (not shown) applying an on/off signal to the TFT. The gate electrode 104 may be formed of a low resistance metal material, and may have a multilayer or single layer structure formed of a conductive material, such as molybdenum (Mo), aluminum (Al), copper (Cu), or titanium (Ti).

An interlayer insulating film 105 is formed on the gate electrode 104. The interlayer insulating film 105 insulates the source and drain electrodes 106a and 106b and the gate electrode 104 from each other. The interlayer insulating film 105 may have a multilayer or single layer structure formed of an inorganic material. For example, the inorganic material may be a metal oxide or a metal nitride, in detail, may be silicon oxide (SiO$_2$), silicon nitride (SiNx), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZrO$_2$).

The source and drain electrodes 106a and 106b are formed on the interlayer insulating film 105. The source and drain electrodes 106a and 106b respectively contact the source and drain regions 102a and 102b of the active layer 102 through contact holes formed through the interlayer insulating film 105 and the gate insulating film 103. A capping film 107 and a planarization film 108 are formed on the TFT formed as above.

The capping film 107 may have a multilayer or single layer structure formed of an insulating inorganic material. For example, the insulating inorganic material may be metal oxide or metal nitride, in detail, SiO$_2$, SiNx, SiON, Al$_2$O$_3$, TiO$_2$, Ta$_2$O$_5$, HfO$_2$, or ZrO$_2$.

The planarization film 108 is formed to cover the capping film 107. The planarization film 108 may have a multilayer or single layer structure formed of an inorganic material and/or an organic material. For example, the inorganic material may be metal oxide or metal nitride, in detail, SiO$_2$, SiNx, SiON, Al$_2$O$_3$, TiO$_2$, Ta$_2$O$_5$, HfO$_2$, or ZrO$_2$. Meanwhile, the organic material may be a common general polymer such as polymethylmethacrylate (PMMA) or polystyrene (PS), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer, or a blend thereof. Also, the planarization film 108 may have a complex stacked structure of an inorganic insulating film and an organic insulating film. The planarization film 108 resolves a stepped difference caused by the TFT array and flattens the top surface, thereby preventing a defect in the OLED caused by a lower unevenness.

The OLED is formed on top of the planarization film 108 corresponding to the display area DA. The OLED includes a lower electrode 109a formed on the planarization film 108, an upper electrode 112 facing the lower electrode 109a, and an intermediate layer 111 disposed between the lower and upper electrodes 109a and 112. According to a light-emitting direction of the OLED, the display device is classified into a bottom emission type, a top emission type, and a dual emission type. In the bottom emission type, the lower electrode 109a is used as a light transmissive electrode and the upper electrode 112 is used as a reflective electrode. In the top emission type, the lower electrode 109a is used as a reflective electrode and the upper electrode 112 is used as a semi-transmissive electrode. In the dual emission type, both the lower and upper electrodes 109a and 112 are used as light transmissive electrodes.

When the lower electrode 109a is used as an anode, the lower electrode 109a may include at least one material having a high work function selected from the group consisting of indium tin oxide (ITO), indium zinc oxide (IZO), zinc oxide (ZnO), indium oxide (In$_2$O$_3$), indium gallium oxide (IGO), and aluminum zinc oxide (AZO). The lower electrode 109a may be patterned in an island shape corresponding to each pixel. Also, the lower electrode 109a may receive a current by being connected to the drain electrode 106b of the TFT.

Meanwhile, a pixel define layer (PDL) 110a formed of an insulating material is formed on the lower electrode 109a to cover the lower electrode 109a. The PDL 110a may be formed of at least one organic insulating material selected from the group consisting of polyimide, polyamide, acryl resin, benzocyclobutene, and phenol resin, via a spin coating method. A predetermined opening defining a pixel is formed on the PDL 110a. The intermediate layer 111 is formed in a region limited by at least the opening.

The intermediate layer 111 may include an organic emissive layer emitting red, green, or blue light, wherein the organic emissive layer may use a low molecular weight organic material or a high molecular weight organic material. When the organic emissive layer is a low molecular weight organic layer formed of a low molecular organic material, a hole transport layer (HTL) and a hole injection layer (HIL) are disposed towards the lower electrode 109a, and an electron transport layer (ETL) and an electron injection layer (EIL) are stacked towards the upper electrode 112, based on the organic emissive layer. Here, various layers as well as the HIL, the HTL, the ETL, and the EIL may be stacked if required.

In the above embodiment, the organic emissive layers are formed according to pixels. In this case, red, blue, or green light may be emitted according to pixels, and a pixel group emitting red, green, and blue lights may form one unit pixel. However, alternatively, the organic emissive layer may be commonly formed throughout pixels. For example, a plurality of organic emissive layers emitting red, green, and blue lights may be vertically stacked or mixed to emit a white light. Of course, a combination of colors for emitting a white light is not limited thereto. Here, a color converting layer or a color filter may be separately used to convert the white light to a predetermined color.

The upper electrode 112 may be formed of a conductive inorganic material. When the upper electrode 112 is used as a cathode, the upper electrode 112 may be formed of Al, Mg, or Ag having a low work function. The upper electrode 112 may be a common electrode formed throughout the display area DA where an image is realized. Here, the upper electrode 112 may be formed via an evaporation process that does not damage the intermediate layer 111.

Meanwhile, the polarities of the lower electrode 109a and the upper electrode 112 may be interchanged.

An insulating passivation film 113 is formed on the upper electrode 112. A work function of the upper electrode 112 may be changed while the encapsulation thin film 114 is formed via a sputtering process or a plasma enhanced chemical vapor deposition (PECVD) process. Also, the organic material included in the intermediate layer 111 may be damaged. Thus, the insulating passivation film 113 may be formed to cover the upper electrode 112. The insulating passivation film 113 may have a multilayer or single layer structure formed of an insulating inorganic material. For example, the insulating inorganic material may be metal oxide, metal nitride, or metal fluoride. In detail, the insulating inorganic material may be fluoride of alkali metal. When the OLED is a top emission type or dual emission type, light may penetrate through the insulating passivation film 113. The insulating passivation film 113 is formed through an evaporation process that does not damage the upper electrode 112 and the intermediate layer 111. According to an embodiment, in the top emission type, a conductive or semiconductor organic layer may be further formed between the upper electrode 112 and the insulating passivation film 113. The conductive or semiconductor organic layer may include light extraction efficiency. The conductive or semiconductor organic layer may be formed through an evaporation process.

Meanwhile, the upper electrode 112 may receive an electric signal or power by being connected to a wire portion of the peripheral area PA.

The wire portion includes the wire 106c and the connecting pad 109b.

The wire 106c applies an electric signal or power received from the outside to the upper electrode 112. Thus, the wire 106c is formed of a conductive inorganic material capable of satisfactorily transferring a current, for example, may have a multilayer or single layer structure formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu). The wire 106c is formed on the interlayer insulating film 105. The wire 106c may be simultaneously formed while forming the source and drain electrodes 106a and 106b of the TFT. Here, the wire 106c may be formed of the same conductive inorganic material as the source and drain electrodes 106a and 106b.

Meanwhile, since the wire 106c is formed on the interlayer insulating film 105, a top surface (indicated by X) of the wire 106c is located downward from a bottom surface (indicated by Y) of the planarization film 108. Thus, when a stress is applied in a parallel direction to the planarization film 108, a structure between the top surface of the wire 106c and the bottom surface of the planarization film 108 may function as a buffer. Accordingly, even when a stress is applied, adhesion between the wire 106c and the encapsulation thin film 114 may be maintained.

The capping film 107 is formed to cover the wire 106c. As described above, the capping film 107 may have a multilayer or single layer structure formed of an insulating inorganic material. An opening is formed on the capping film 107 to expose a part of the wire 106c. In other words, the capping film 107 is formed throughout the display area DA and the peripheral area PA, and includes an opening that covers the edge of the wire 106c and exposes the center of the wire 106c. The wire 106c and the upper electrode 112 are electrically connected to each other, but are physically apart from each other since they are formed in different layers. Accordingly, the connecting pad 109b electrically connecting the wire 106c and the upper electrode 112 is required. The opening is formed on the capping film 107 as a contact hole for the connecting pad 109b to contact the wire 106c.

The connecting pad 109b transfers an electric signal or power received from the wire 106c to the upper electrode 112. The connecting pad 109b functions as a bridge or link. Accordingly, the connecting pad 109b is formed of a conductive inorganic material capable of satisfactorily transferring a current, and may have a multilayer or single layer structure formed of one or more metals selected from the group consisting of Al, Pt, Pd, Ag, Mg, Au, Ni, Nd, Ir, Cr, Li, Ca, Mo, Ti, W, and Cu. Meanwhile, a side portion of the planarization film 108 described above is disposed in the peripheral area PA, wherein the connecting pad 109b is disposed along side and top surfaces of the planarization film 108. One end of the connecting pad 109b contacts the wire 106c exposed by the opening of the capping film 107, and the other end contacts the upper electrode 112. According to an embodiment, the connecting pad 109b may be formed together with the lower electrode 109a in the same material as the lower electrode 109a.

An organic spacer 110b is formed on a region where the wire 106c and the connecting pad 109b contact each other. The organic spacer 110b may be formed of at least one organic insulating material selected from the group consisting of polyimide, polyamide, acryl resin, benzocyclobutene, and phenol resin, and may be formed together with the PDL 110a in the same material as the PDL 110a. The organic spacer 110b may have a closed shape continuously surrounding the display area DA, or an opened shape discontinuously surrounding the display area DA. The organic spacer 110b supports a mask during an evaporation process for forming various films in the display area DA. Also, the organic spacer 110b operates as a buffer with respect to a temporary shock applied to the peripheral area PA, and absorbs the temporary shock. Meanwhile, the organic spacer 110b is formed on the region where the wire 106c and the connecting pad 109b contact each other, and thus prevents the connecting pad 109b from detached and prevents a connection defect.

The encapsulation thin film 114 is formed throughout the substrate 100 to cover all of the display area DA and the peripheral area PA. The encapsulation thin film 114 is formed to protect the OLED from external moisture or oxygen. The encapsulation thin film 114 may have a multilayer or single layer structure formed of an insulating inorganic material. For example, the insulating inorganic material may be metal oxide or metal nitride, in detail, $SiO_2$, SiNx, SiON, $Al_2O_3$, $TiO_2$, $Ta_2O_5$, $HfO_2$, or $ZrO_2$.

In the display area DA, the encapsulation thin film 114 covers the insulating passivation film 113 formed on the upper electrode 112. Since the insulating passivation film 113 is formed of an insulating inorganic material and the encapsulation thin film 114 is also formed of an insulating inorganic material, they have good adhesion. Accordingly, the display device may have a strong sealing structure in the display area DA.

Meanwhile, the peripheral area PA includes at least one inorganic area IOA having a closed shape continuously surrounding the display area DA. In detail, the peripheral area PA includes a first inorganic area IOA1 and a second inorganic area IOA2, and an organic area OA disposed therebetween. Here, the inorganic area IOA means an area where the encapsulation thin film 114 formed of the insulating inorganic material inorganic-inorganic contacts an inorganic surface portion formed on the substrate 100. Also, the organic area OA means an area where the encapsulation thin film 114 formed of the insulating inorganic material inorganic-organic contacts an organic surface portion formed on the substrate 100.

The first inorganic area IOA1 is located in an outermost edge of the substrate 100. The first inorganic area IOA1 is an area where the capping film 107 formed of the insulating inorganic material and the encapsulation thin film 114 formed of the insulating inorganic material contact each other. Also, as in a region A of FIG. 2, the first inorganic area IOA1 also includes an area where a stepped surface formed by the top surface of the wire 106c including the conductive inorganic material exposed by the opening of the capping film 107 and the side surface of the capping film 107 formed by the opening contacts the encapsulation thin film 114. As such, by including the first inorganic area IOA1 contacting an inorganic surface on the encapsulation thin film 114 and the substrate 100, a strong encapsulation structure may be realized and moisture permeability may be effectively prevented. Specifically, since the first inorganic area IOA1 is located at the outermost edge of the substrate 100, moisture or oxygen from a side portion of the display device may be effectively blocked. Also, since the first inorganic area IOA1 includes the stepped surface as shown in the region A, the stepped surface may operate as a buffer while a structure expands due to heat, thereby maintaining adhesion between the encapsulation thin film 114 and the lower surface.

In detail, the wire 106c and the capping film 107 each expands due to heat generated in the wire 106c according to a current flow or heat transferred from outside/inside of the display device. Here, since the wire 106c and the capping film 107 are formed of different materials, the rates of expansion are different. Due to the different rates of expansion, adhesion between the encapsulation thin film 114 and the wire 106c, and the capping film 107 may deteriorate. However, according to the current embodiment, since a contact region between the encapsulation thin film 114 and the lower structure is increased by the stepped surface like the region A, strong adhesion may be maintained despite of heat. Also, since the stepped surface like the region A may function as a type of buffer providing a spatial margin regarding expansion, adhesion between the encapsulation thin film 114 and the lower structure may be prevented from being decreased due to expansion.

Then, the second inorganic area IOA2 is disposed adjacent to the display area DA. The second inorganic area IOA2 includes an area where the connecting pad 109b formed of the conductive inorganic material contacts the insulating passivation film 113 formed of the insulating inorganic material and the encapsulation thin film 114 formed of the insulating inorganic material. Also, the second inorganic area IOA2 includes an area where a stepped surface formed by the side surface of the insulating passivation film 113 on the connecting pad 109b contacts the encapsulation thin film 114 as shown in a region B of FIG. 2. As such, in the current embodiment, by additionally including the second inorganic area IOA2 as well as the first inorganic area IOA1 contacting an inorganic surface on the encapsulation thin film 114 and the substrate 100, an encapsulation structure may be further strong, and moisture permeability may be effectively blocked. Also, since the second inorganic area IOA2 also includes the stepped surface like the region B, the stepped surface may function as a buffer while the structure expands due to heat, thereby maintaining adhesion between the encapsulation thin film 114 and the lower surface.

In detail, the connecting pad 109b and the insulating passivation film 113 each expands due to heat generated in the connecting pad 109b according to a current flow or heat transferred from outside/inside of the OLED. Here, since the connecting pad 109b and the insulating passivation film 113 are formed of different materials, the rates of expansion are different. Due to the different rates of expansion, adhesion between the encapsulation thin film 114 and the connecting pad 109b, and the insulating passivation film 113 may deteriorate. However, according to the current embodiment, since a contact region between the encapsulation thin film 114 and the lower structure is increased by the stepped surface like the region B, strong adhesion may be maintained despite of heat. Also, since the stepped surface may function as a type of buffer providing a spatial margin regarding expansion, adhesion between the encapsulation thin film 114 and the lower structure may be prevented from being decreased due to expansion.

In the peripheral area PA, the organic area OA is formed between the first inorganic area IOA1 and the second inorganic area IOA2. The organic area OA is an area where the organic spacer 110b and the encapsulation thin film 114 formed of the insulating inorganic material contact each other.

As shown in FIG. 1, if the organic spacer 110b has a closed shape continuously surrounding the display area DA, the organic area OA also has a closed shape continuously surrounding the display area DA. Alternatively, as shown in FIG. 3, if the organic spacer 110b has an opened shape discontinuously surrounding the display area DA, the organic area OA also has an opened shape discontinuously surrounding the display area DA.

Figure 4:
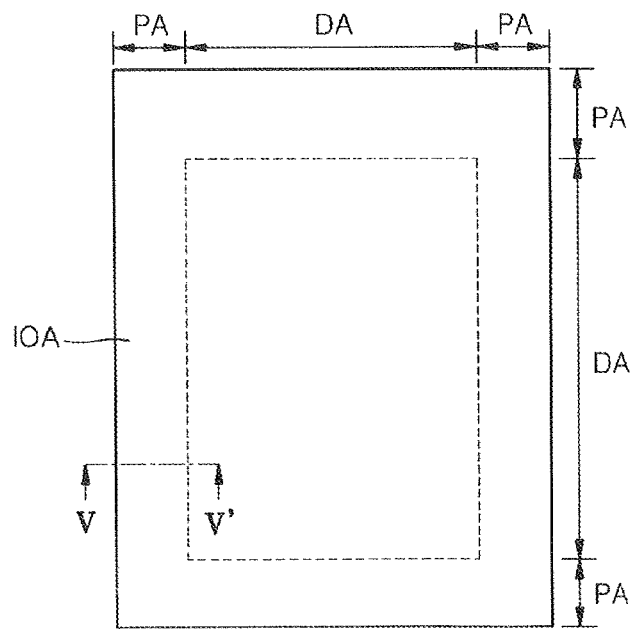
FIG. 4 is a plan view schematically illustrating a structure of a display device, according to another embodiment of the present invention.
Figure 5:
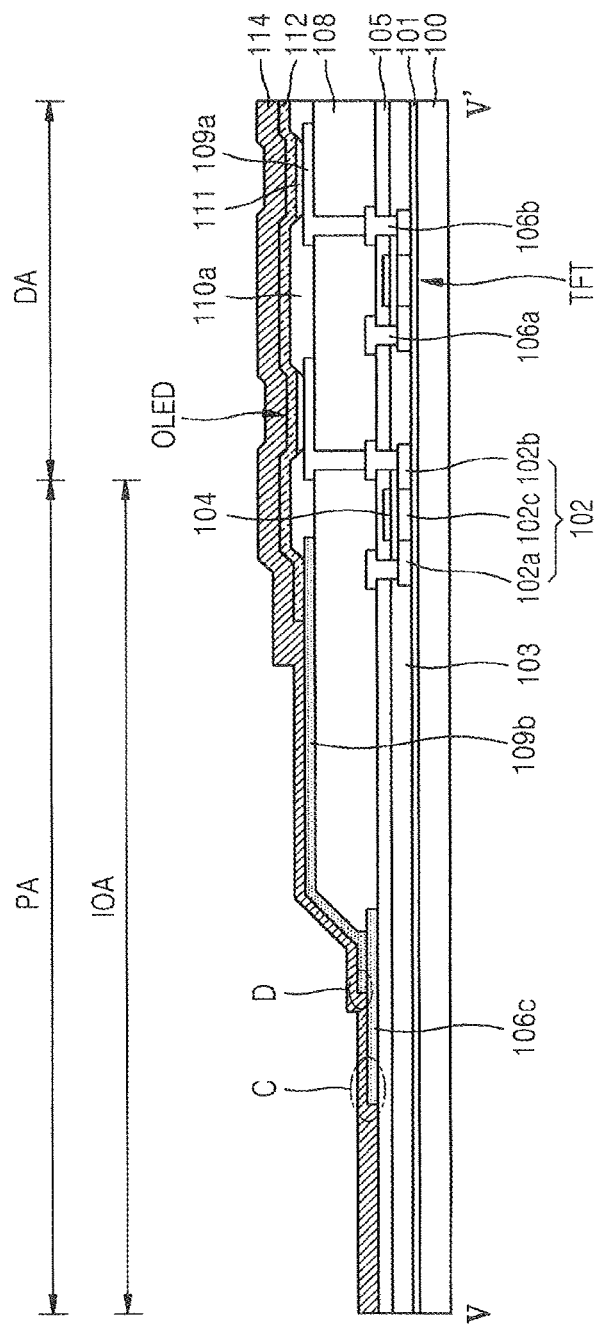
FIG. 5 is a cross-sectional view taken along a line V-V' of FIG. 4.

FIG. 4 is a plan view schematically illustrating a structure of a display device, according to another embodiment of the present invention. FIG. 5 is a cross-sectional view taken along a line V-V' of FIG. 4.

The current embodiment of FIGS. 4 and 5 is different from the embodiment of FIGS. 1 through 3 in that the organic spacer 110*b*, the capping film 107, and the insulating passivation film 113 are not used. Since components of FIGS. 4 and 5 denoted by the same reference numerals as those of FIGS. 1 through 3 have the same or similar functions as the components of FIGS. 1 through 3, overlapping descriptions thereof will not be repeated. According to the current embodiment, at least one of the organic spacer 110*b*, the capping film 107, and the insulating passivation film 113 may be employed.

In reference to FIGS. 4 and 5, in the display area DA, the encapsulation thin film 114 directly covers the upper electrode 112. Here, since the upper electrode 112 is formed of a conductive inorganic material and the encapsulation thin film 114 is formed of an insulating inorganic material, the upper electrode 112 and the encapsulation thin film 114 have satisfactory adhesion via inorganic-inorganic contact. Accordingly, like the previous embodiment the display device may have a strong sealing structure in the display area DA.

Meanwhile in FIGS. 4 and 5, only the inorganic area IOA is included in the peripheral area PA. The inorganic area IOA is located at the outermost edge of the substrate 100 surrounding the display area DA. The inorganic area IOA includes an area where the interlayer insulating film 105 formed of an insulating inorganic material, the wire 106*c* formed of a conductive inorganic material, and the connecting pad 109*b* contact the encapsulation thin film 114 formed of an insulating inorganic material. Specifically, the inorganic area IOA includes a stepped surface formed by a side surface of the wire 106*c* contacting the encapsulation thin film 114 like a region C and a stepped surface formed by a side surface of the connecting pad 109*b* contacting the encapsulation thin film 114 like a region D of FIG. 5.

In particular, since the capping film 107 is not used in the embodiment of FIGS. 4 and 5, the side surface of the wire 106*c* is exposed on the interlayer insulating film 105. Accordingly, a stepped surface like a region C is further formed by the side surface of the wire 106*c*.

As described above, the stepped surfaces included in the inorganic area IOA operates as a buffer while the structure expands due to heat, thereby maintaining adhesion between the encapsulation thin film 114 and the lower surface. In detail, the wire 106*c*, the connecting pad 109*b*, and the interlayer insulating film 105 each expands due to heat generated in the wire 106*c* and the connecting pad 109*b* according to a current flow or heat transferred from outside/inside of the display device. When the wire 106*c*, the connecting pad 109*b*, and the interlayer insulating film 105 are formed of different materials, the rates of expansion may be different, thereby deteriorating adhesion toward the encapsulation thin film 114. However, since the stepped surfaces like the regions C and D may increase a contact area and operate as a buffer with respect to expansion, adhesion of top surfaces and/or side surfaces of the wire 106*c*, the connecting pad 109*b*, and the interlayer insulating film 105 to a bottom surface of the encapsulation tin film 114 may be strongly and continuously maintained.

Figure 6:
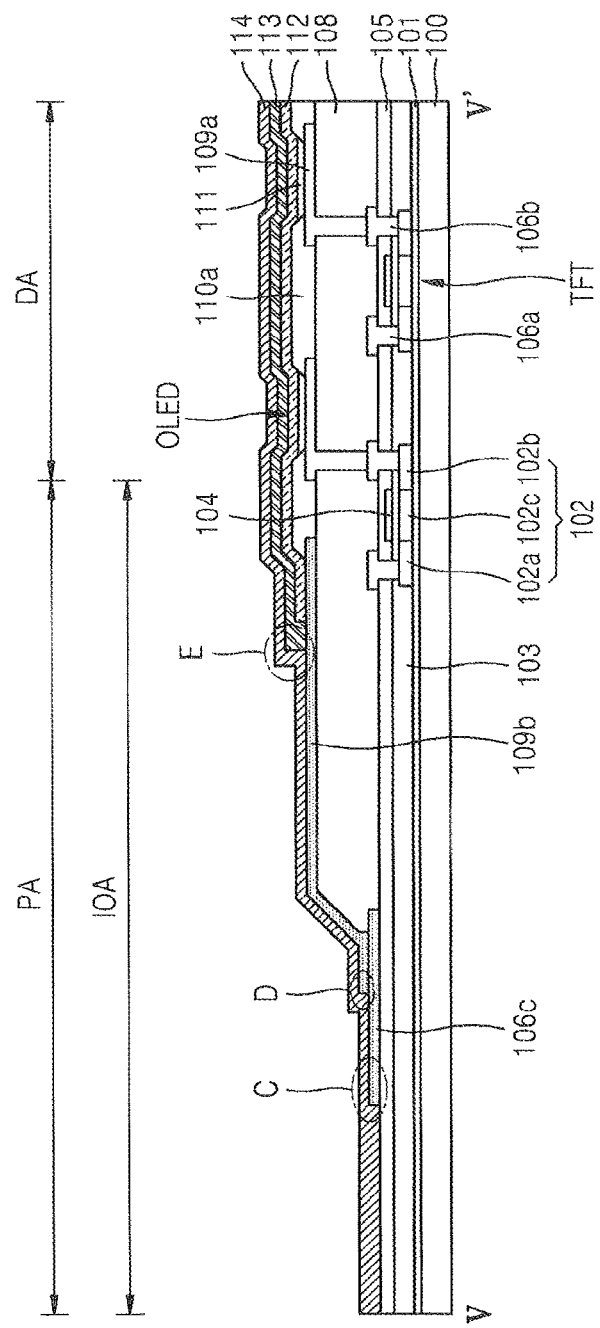
FIG. 6 is a cross-sectional view schematically illustrating a structure of a display device, according to an embodiment of the present invention.

FIG. 6 is a cross-sectional view schematically illustrating a structure of a display device, according to an embodiment of the present invention. FIG. 6 corresponds to the cross-sectional view taken along the line V-V' of FIG. 4, like FIG. 5.

Referring to FIG. 6, unlike FIG. 5, the passivation film 113 formed of an insulating inorganic material is further formed on the upper electrode 112. Since components of FIG. 6 denoted by the same reference numerals as those of FIGS. 1 through 5 have the same or similar functions as the components of FIGS. 1 through 5, overlapping descriptions thereof will not be repeated.

Like the region B of FIG. 2, a region E of FIG. 6 the stepped surface formed by the side surface of the passivation film 113 on the connecting pad 109*b* contacts the encapsulation thin film 114. The stepped surface like the region E may strongly maintain the adhesion of the bottom surface of the encapsulation thin film 114 and the connecting pad 109*b* to the passivation film 113, like the region B.

Herein, the display device is an organic luminescent display device including the OLED, but alternatively, the display device may have another structure including the inorganic encapsulation thin film 114.

According to another embodiment of the present invention, an inorganic area may include at least two stepped surfaces overlappingly selected from among a first stepped surface like the region A of FIG. 2, a second stepped surface like the region B of FIG. 2 or the region E of FIG. 6, and a third stepped surface like the region C or D of FIGS. 5 and 6. In this case, strong adhesion may be maintained despite of different rates of expansion between an insulator and a conductor and a stress applied in a parallel direction to a substrate. Although not illustrated, a thin film formed of an organic material and a thin film formed of an inorganic material may be further alternately stacked on the inorganic encapsulation thin film 114 to form an encapsulation structure. Here, an organic layer may be formed of polymer, and in detail, may be a single film or a stacked film formed of any one of polyethyleneterephthalate, polyimide, polycarbonate, epoxy, polyethylene, and polyacrylate. An uppermost layer externally exposed in such an encapsulation structure may be an inorganic layer so as to prevent moisture permeability to an OLED. Such an encapsulation structure may include at least one sandwich structure in which at least one organic layer is inserted between at least two inorganic layers. Alternatively, the encapsulation structure may include at least one sandwich structure in which at least one inorganic layer is inserted between at least two organic layers.

For example, such an encapsulation structure may include a first inorganic layer corresponding to the inorganic encapsulation thin film 114, a first organic layer, and a second inorganic layer sequentially from a top of the OLED. Alternatively, the encapsulation structure may include a first inorganic layer, a first organic layer, a second inorganic layer, a second organic layer, and a third inorganic layer sequentially from the top of the OLED. Alternatively, the encapsulation structure may include a first inorganic layer, a first organic layer, a second inorganic layer, a second organic layer, a third inorganic layer, a third organic layer, and a fourth inorganic layer sequentially from the top of the OLED. Here, the first organic layer may have a smaller area than the second inorganic layer, and the second organic layer may have a smaller area than the third inorganic layer. Also, the first organic layer may be completely covered by the second inorganic layer, and the second organic layer may also be completely covered by the third inorganic layer.

Meanwhile, the OLED may be efficiently sealed as a sealing substrate adhered by a sealing member, such as a sealant or frit, is further formed on an inorganic encapsulation thin film or an encapsulation structure.

Meanwhile, active type driving is described herein but alternatively, a passive type driving that does not use a TFT may also be used. Here, a layer where a TFT array is formed is omitted.

According to one or more embodiments of the present invention, a stronger sealing structure may be realized by adhering an inorganic surface portion of a display device to an inorganic encapsulation thin film.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electroluminescent device, comprising:
a lower structure which has an emission area and a peripheral area surrounding the emission area, and which comprises a first insulation film including an inorganic material, a second insulation film located on the first insulation film, a lower electrode located on the second insulation film, an electroluminescent layer located on the lower electrode, an upper electrode located on the electroluminescent layer, and a conductor located on a top surface of the first insulation film, and side and top surfaces of the second insulation film to be electrically connected to the upper electrode, and
a flexible encapsulation multilayer located on the emission and peripheral areas of the lower structure, including at least three layers, and having a bottom surface comprising only at least one inorganic material,
wherein the conductor comprises a first inorganic wiring extending on the top surface of the first insulation film along a periphery of the emission area, and a second inorganic wiring which extends on the side and top surfaces of the second insulation film along the periphery of the emission area, which has a bottom surface facing a top surface of the first inorganic wiring to electrically communicate with the top surface of the first inorganic wiring, and which has a top surface facing a bottom surface of the upper electrode to electrically communicate with the bottom surface of the upper electrode,
wherein a surface of the peripheral area comprises an inorganic surface portion located outside the upper electrode in a plan view, and substantially surrounding the emission area of the lower structure,
wherein an entire of the inorganic surface portion directly contacts the bottom surface of the flexible encapsulation multilayer,
wherein the inorganic surface portion comprises a plurality of stepped surface portions, each including a top surface portion of the first insulation film, a side surface portion of the first inorganic wiring, and a top surface portion of the first inorganic wiring, and
wherein the first inorganic wiring has an inner edge portion and an outer edge portion substantially opposite to the inner edge portion, the outer edge portion of the first inorganic wiring is substantially farther than the inner edge portion from the emission area, the outer edge portion of the first inorganic wiring is located under the bottom surface of the flexible encapsulation multilayer, and the outer edge portion of the first inorganic wiring is not in direct contact with the bottom surface of the flexible encapsulation multilayer.

2. The electroluminescent device of claim 1, wherein the inorganic surface portion further comprises a plurality of stepped surface portions, each including a top surface portion of the first inorganic wiring, a side surface portion of the second inorganic wiring, and a top surface portion of the second inorganic wiring, and
wherein the second inorganic wiring has an inner edge portion and an outer edge portion substantially opposite to the inner edge portion, the outer edge portion of the second inorganic wiring is substantially farther than the inner edge portion from the emission area, the outer edge portion of the second inorganic wiring is located under the bottom surface of the flexible encapsulation multilayer, and the outer edge portion of the second inorganic wiring is not in direct contact with the bottom surface of the flexible encapsulation multilayer.

3. The electroluminescent device of claim 1, wherein the inorganic surface portion further comprises a plurality of stepped surface portions, each including a top surface portion of the first insulation film, a side surface portion of the second inorganic wiring, and a top surface portion of the second inorganic wiring, and
wherein the second inorganic wiring has an inner edge portion and an outer edge portion substantially opposite to the inner edge portion, the outer edge portion of the second inorganic wiring is substantially farther than the inner edge portion from the emission area, the outer edge portion of the second inorganic wiring is located under the bottom surface of the flexible encapsulation multilayer, and the outer edge portion of the second inorganic wiring is not in direct contact with the bottom surface of the flexible encapsulation multilayer.

4. The electroluminescent device of claim 1, wherein the inorganic surface portion further comprises a plurality of stepped surface portions, each including a top surface portion of the first inorganic wiring, a side surface portion of the second inorganic wiring, and a top surface portion of the second inorganic wiring,
wherein the inorganic surface portion further comprises a plurality of stepped surface portions, each including a top surface portion of the first insulation film, a side surface portion of the second inorganic wiring, and a top surface portion of the second inorganic wiring, and
wherein the second inorganic wiring has an inner edge portion and an outer edge portion substantially opposite to the inner edge portion, the outer edge portion of the second inorganic wiring is substantially farther than the inner edge portion from the emission area, the outer edge portion of the second inorganic wiring is located under the bottom surface of the flexible encapsulation multilayer, and the outer edge portion of the second inorganic wiring is not in direct contact with the bottom surface of the flexible encapsulation multilayer.

5. The electroluminescent device of claim 1, further comprising an organic layer which is located between the upper electrode and the bottom surface of the flexible encapsulation multilayer, which is in direct contact with the upper electrode, and which has a conductive or semiconductive property.

6. An electroluminescent device, comprising:
a lower structure which has an emission area and a peripheral area surrounding the emission area, and which comprises a first insulation film, a second insulation film located on the first insulation film, a lower electrode located on the second insulation film, an electroluminescent layer located on the lower electrode, an upper electrode located on the electroluminescent layer, and a conductor located on a top surface of the first insulation film, and side and top surfaces of the second insulation film to be electrically connected to the upper electrode, and a flexible encapsulation multilayer located on the emission and peripheral areas of the lower structure, including at least three layers, and having a bottom surface comprising only at least one inorganic material, wherein a surface of the peripheral area comprises an inorganic surface portion located outside the upper electrode in a plan view, and substantially surrounding the emission area of the lower structure, wherein an entire of the inorganic surface portion directly contacts the bottom surface of the flexible encapsulation multilayer, wherein the conductor comprises a first inorganic wiring located on the top surface of the first insulation film, and a second inorganic wiring located on the side and top surfaces of the second insulation film, the second inorganic wiring having a bottom surface facing a top surface of the first inorganic wiring to electrically communicate with the top surface of the first inorganic wiring, the second inorganic wiring having a top surface facing a bottom surface of the upper electrode to electrically communicate with the bottom surface of the upper electrode, and wherein at least a portion of a surface of the conductor directly contacts the bottom surface of the flexible encapsulation multilayer to be included in the inorganic surface portion.

7. The electroluminescent device of claim 6, further comprising an organic layer which is located between the upper electrode and the bottom surface of the flexible encapsulation multilayer, which is in direct contact with the upper electrode, and which has a conductive or semiconductive property.

8. An electroluminescent device, comprising:
a lower structure which has an emission area and a peripheral area surrounding the emission area, and which comprises a first insulation film, a second insulation film located on the first insulation film, a lower electrode located on the second insulation film, an electroluminescent layer located on the lower electrode, and an upper electrode located on the electroluminescent layer, and a flexible encapsulation multilayer located on the emission and peripheral areas of the lower structure, including at least three layers, and having a bottom surface comprising only at least one inorganic material, wherein a surface of the peripheral area comprises an inorganic surface portion located outside the upper electrode in a plan view, substantially surrounding the emission area of the lower structure, and comprising a plurality of inorganic surface branches spaced apart from each other, wherein the surface of the peripheral area comprises an organic surface portion substantially surrounding the emission area of the lower structure, having a predetermined height, and located between the inorganic surface branches to be substantially surrounded by the inorganic surface portion, wherein an entire of the inorganic surface portion and an entire of the organic surface portion are in direct contact with the bottom surface of the flexible encapsulation multilayer, wherein the inorganic surface branches include an outer inorganic surface branch located outer than the organic surface portion and an inner inorganic surface branch located inner than the organic surface portion, wherein a height of the inner inorganic surface branch is substantially larger than a height of the outer inorganic surface branch, wherein the lower structure further comprises a first inorganic wiring located on a top surface of the first insulation film, and a second inorganic wiring located on side and top surfaces of the second insulation film, the second inorganic wiring having a bottom surface facing a top surface of the first inorganic wiring to electrically communicate with the top surface of the first inorganic wiring, the second inorganic wiring having a top surface facing a bottom surface of the upper electrode to electrically communicate with the bottom surface of the upper electrode, and wherein the inner inorganic surface branch includes at least a portion of the top surface of the second inorganic wiring.

9. The electroluminescent device of claim 8, wherein a portion of a surface of the first inorganic wiring directly contacts the bottom surface of the flexible encapsulation multilayer, and
wherein the portion of the surface of the first inorganic wiring is substantially farther than the organic surface portion from the emission area.

10. The electroluminescent device of claim 9, wherein the portion of the surface of the first inorganic wiring, which directly contacts the bottom surface of the flexible encapsulation multilayer, is included in the outer inorganic surface branch.

11. An electroluminescent device, comprising:
a lower structure which has an emission area and a peripheral area surrounding the emission area, and which comprises a first insulation film, an inorganic capping film located on the first insulation film, a second insulation film located on the inorganic capping film, a lower electrode located on the second insulation film, an electroluminescent layer located on the lower electrode, an upper electrode located on the electroluminescent layer, and a conductor located on a top surface of the first insulation film, and side and top surfaces of the second insulation film to be electrically connected to the upper electrode, and a flexible encapsulation multilayer located on the emission and peripheral areas of the lower structure, including at least three layers, and having a bottom surface comprising only at least one inorganic material, wherein the conductor comprises a first inorganic wiring extending on the top surface of the first insulation film along a periphery of the emission area, and a second inorganic wiring which extends on the side and top surfaces of the second insulation film along the periphery of the emission area, which has a bottom surface facing a top surface of the first inorganic wiring to electrically communicate with the top surface of the first inorganic wiring, and which has a top surface facing a bottom surface of the upper electrode to electrically communicate with the bottom surface of the upper electrode, wherein a surface of the peripheral area comprises an inorganic surface portion located outside the upper electrode in a plan view, and substantially surrounding the emission area of the lower structure, wherein an entire of the inorganic surface portion directly contacts the bottom surface of the flexible encapsulation multilayer, and wherein the inorganic capping film has an opening exposing the top surface of the first inorganic wiring.

12. The electroluminescent device of claim 11, further comprising an organic spacer which is located on a region where the first inorganic wiring and the second inorganic wiring are in direct contact with each other, and which is located under the bottom surface of the flexible encapsulation multilayer.

13. The electroluminescent device of claim 11, wherein the first inorganic wiring has an inner edge portion and an outer edge portion substantially opposite to the inner edge portion, the outer edge portion of the first inorganic wiring is substantially farther than the inner edge portion from the emission area, the outer edge portion of the first inorganic wiring is located under the bottom surface of the flexible encapsulation multilayer, and the inorganic capping film is located between the outer edge portion of the first inorganic wiring and the bottom surface of the flexible encapsulation multilayer such that the outer edge portion of the first inorganic wiring is not in direct contact with the bottom surface of the flexible encapsulation multilayer.

14. The electroluminescent device of claim 11, wherein the second inorganic wiring has an inner edge portion and an outer edge portion substantially opposite to the inner edge portion, the outer edge portion of the second inorganic wiring is substantially farther than the inner edge portion from the emission area, the outer edge portion of the second inorganic wiring is located under the bottom surface of the flexible encapsulation multilayer, and the outer edge portion of the second inorganic wiring is not in direct contact with the bottom surface of the flexible encapsulation multilayer.

15. The electroluminescent device of claim 11, wherein the first inorganic wiring has an inner edge portion and an outer edge portion substantially opposite to the inner edge portion, the outer edge portion of the first inorganic wiring is substantially farther than the inner edge portion from the emission area, the outer edge portion of the first inorganic wiring is located under the bottom surface of the flexible encapsulation multilayer, and the inorganic capping film is located between the outer edge portion of the first inorganic wiring and the bottom surface of the flexible encapsulation multilayer such that the outer edge portion of the first inorganic wiring is not in direct contact with the bottom surface of the flexible encapsulation multilayer; and wherein the second inorganic wiring has an inner edge portion and an outer edge portion substantially opposite to the inner edge portion, the outer edge portion of the second inorganic wiring is substantially farther than the inner edge portion from the emission area, the outer edge portion of the second inorganic wiring is located under the bottom surface of the flexible encapsulation multilayer, and the outer edge portion of the second inorganic wiring is not in direct contact with the bottom surface of the flexible encapsulation multilayer.

16. The electroluminescent device of claim 11, further comprising an organic layer which is located between the upper electrode and the bottom surface of the flexible encapsulation multilayer, which is in direct contact with the upper electrode, and which has a conductive or semi-conductive property.

17. An electroluminescent device, comprising:

a lower structure which has an emission area and a peripheral area surrounding the emission area, and comprises a first insulation film, a second insulation film located on the first insulation film, a lower electrode located on the second insulation film, an electroluminescent layer located on the lower electrode, an upper electrode located on the electroluminescent layer, and a conductor located on a top surface of the first insulation film, and side and top surfaces of the second insulation film to be electrically connected to the upper electrode, and a flexible encapsulation multilayer located on the emission and peripheral areas of the lower structure, including at least three layers, and having a bottom surface comprising only at least one inorganic material, wherein the emission area includes a plurality of emission regions each in which all of the lower electrode, the electroluminescent layer, and the upper electrode simultaneously overlap one another in a plan view, a light being emitted from the emission region, wherein the conductor comprises a first inorganic wiring extending on the top surface of the first insulation film, and a second inorganic wiring extending on the side and top surfaces of the second insulation film and a top surface of the first inorganic wiring, the second inorganic wiring being not overlapped with the emission region in a plan view, the second inorganic wiring having a bottom surface facing the top surface of the first inorganic wiring to electrically communicate with the top surface of the first inorganic wiring, the second inorganic wiring having a top surface facing a bottom surface of the upper electrode to electrically communicate with the bottom surface of the upper electrode, wherein a surface of the peripheral area comprises an inorganic surface portion located outside the upper electrode in a plan view, and substantially surrounding the emission area of the lower structure, wherein an entire of the inorganic surface portion contacts the bottom surface of the flexible encapsulation multilayer, wherein a first region where the top surface of the first inorganic wiring contacts the bottom surface of the second inorganic wiring is spaced apart from a second region where the top surface of the second inorganic wiring contacts the bottom surface of the upper electrode such that the first and second regions do not overlap each other in a plan view, and wherein the first region has a height substantially lower than that of the second region.

18. The electroluminescent device of claim 17, wherein the first inorganic wiring is disposed along a periphery of the emission area, and wherein the second inorganic wiring is disposed along the periphery of the emission area.

19. The electroluminescent device of claim 17, further comprising an organic layer which is located between the upper electrode and the bottom surface of the flexible encapsulation multilayer, contacts the upper electrode, and has a conductive or semi-conductive property.

20. The electroluminescent device of claim 19, further comprising a passivation film comprising a fluoride of an alkali metal between the organic layer and the bottom surface of the flexible encapsulation multilayer.

21. The electroluminescent device of claim 17, further comprising an inorganic capping film located on the first insulation film such that the second insulation film is located on the inorganic capping film, wherein the inorganic capping film has an opening exposing the top surface of the first inorganic wiring.

22. The electroluminescent device of claim 17, further comprising an organic structure having a first portion located between the second inorganic wiring and the upper electrode such that the first portion contacts the second inorganic wiring.

23. The electroluminescent device of claim 22, wherein the organic structure further comprises a second portion located above the first region such that the second portion contacts a portion of the second inorganic wiring, the portion of the second inorganic wiring corresponding to the first region.

24. The electroluminescent device of claim 17, wherein the first and second regions are located substantially inner than the entire of the inorganic surface portion.

* * * * *